(12) United States Patent
Nishikawa et al.

(10) Patent No.: US 6,459,290 B1
(45) Date of Patent: Oct. 1, 2002

(54) TEST APPARATUS OF INTEGRATED CIRCUIT

(75) Inventors: Yoshikazu Nishikawa, Kunitachi; Hideo Miyazawa, Kamakura; Hirozo Tanaka, Kawasaki, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 16 days.

(21) Appl. No.: 09/724,089

(22) Filed: Nov. 28, 2000

(30) Foreign Application Priority Data

Nov. 29, 1999 (JP) .......................................... 11-338259

(51) Int. Cl.[7] .............................................. G01R 31/28
(52) U.S. Cl. .................... 324/763; 324/765; 324/158.1; 324/73.1; 324/537
(58) Field of Search ................................ 324/763, 765, 324/754, 158.1, 73.1, 755, 758, 761, 537

(56) References Cited

U.S. PATENT DOCUMENTS

| | | | | |
|---|---|---|---|---|
| 4,961,053 A | * | 10/1990 | Krug | 324/537 |
| 5,053,700 A | * | 10/1991 | Parrish | 324/537 |
| 5,059,899 A | * | 10/1991 | Farnworth | 324/73.1 X |
| 5,136,185 A | | 8/1992 | Fleming et al. | |
| 5,457,400 A | * | 10/1995 | Ahmad et al. | 324/763 |
| 5,513,190 A | | 4/1996 | Johnson et al. | |
| 5,608,335 A | * | 3/1997 | Talliet | 324/763 |
| 5,838,163 A | * | 11/1998 | Restoker et al. | 324/763 |
| 5,936,976 A | | 8/1999 | Story et al. | |
| 5,952,838 A | * | 9/1999 | Tikonov | 324/754 |
| 5,969,538 A | * | 10/1999 | Whetsel | 324/763 |
| 5,973,340 A | * | 10/1999 | Moshen | 257/209 |
| 6,140,833 A | * | 10/2000 | Lietner et al. | 324/765 |
| 6,157,201 A | * | 12/2000 | Leung, Jr. | 324/760 |
| 6,181,146 B1 | * | 1/2001 | Koyoma | 324/755 |

FOREIGN PATENT DOCUMENTS

JP          5-259878          10/1993

OTHER PUBLICATIONS

Patent Abstracts of Japan No. 10–115666, Integrated Circuit Assembled by Test Circuit, Integrated Circuit Device Having the Test Circuit and Test Board and Testing Method for the Integrated Circuit, May 1998.
Patent Abstracts of Japan No. 2000–147058, Device Comprising Self–Diagnosis Function Part, May 2000.

* cited by examiner

Primary Examiner—N. Le
Assistant Examiner—T. R. Sundaram
(74) Attorney, Agent, or Firm—Pearne & Gordon LLP

(57) ABSTRACT

There are provided plural integrated circuits a to i in which a self-diagnostic result obtained from a self-diagnostic circuit 12 is outputted and controlled by select signals 1, 2, 3 supplied from the outside, and each the self-diagnostic result of the plural integrated circuits is respectively supplied to one monitor through a determination signal line every plural self-diagnostic results and control is performed by control signals 1, 2, 3 so that any one of the self-diagnostic results of the plural integrated circuits supplied to the one monitor is outputted.

5 Claims, 6 Drawing Sheets

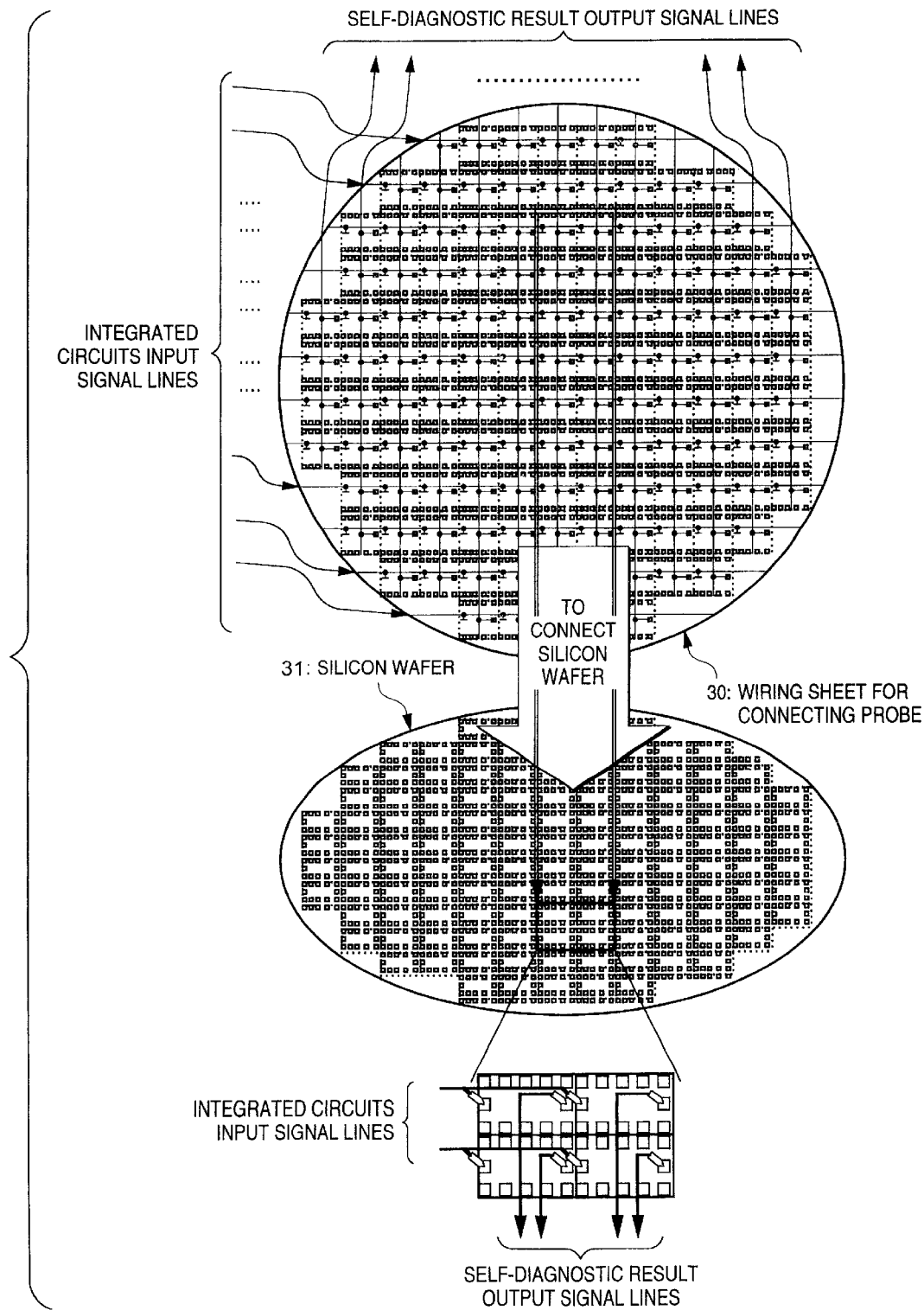

TEST APPARATUS OF INTEGRATED CIRCUIT

BACKGROUND OF THE INVENTION

1. Field of the Invention

The present invention relates to a test apparatus of an integrated circuit for checking operating conditions of plural integrated circuits having a self-diagnostic circuit.

2. Description of the Related Art

Recently, as a method for effectively testing a large-scaled and complicated semiconductor integrated circuit (hereinafter called "integrated circuit"), a burn-in test has been conducted. The burn-in test is a test for checking whether the integrated circuit operates normally under high-temperature environments or not, and is generally conducted in a constant temperature bath. In the burn-in test, an external test apparatus used in a normal test cannot be used, so that a self-diagnostic circuit is mounted in the integrated circuit itself and circuit operations is tested by this self-diagnostic circuit. In a configuration in which the self-diagnostic circuit is built into the integrated circuit, it is constructed so as to output a signal indicating a normal operation to a particular terminal in the case that an operation of the integrated circuit itself has correctly been performed.

A method for testing the integrated circuit will be described below. In self-diagnosis of the integrated circuit, the operating conditions of the integrated circuit can be checked by providing signals (power source application, GND fixing, clock input) necessary for operating the built-in self-diagnostic circuit and monitoring the obtained self-diagnostic results.

FIG. 7 shows a case of testing plural semiconductor integrated circuits on a silicon wafer. As shown in FIG. 7, plural semiconductor integrated circuits having a self-diagnostic circuit are arranged in a matrix shape on a silicon wafer 31, and probes for respectively making connections to each the integrated circuit arranged on the silicon wafer 31 are arranged according to an array pattern of the integrated circuits on a connection probe wired sheet 30. Further, on the connection probe wired sheet 30, input control signal lines for semiconductor integrated circuit (hereinafter called "control signal lines") are arranged in a row direction and output signal lines for self-diagnostic results (hereinafter called "output signal lines") are arranged in a column direction. The control signal lines and the output signal lines, respectively, are connected to each the integrated circuit through the probes and as shown in the drawing, the control signal lines are connected in common with the plural integrated circuits arranged in the row direction and the output signal lines are individually connected to each the integrated circuit.

In the case of testing each the integrated circuit arranged on the silicon wafer 31 in the configuration described above, the connection probe wired sheet 30 and the silicon wafer 31 are overlaid and each the connection probes formed on the connection probe wired sheet 30 is connected to the corresponding integrated circuits formed on silicon wafer 31, respectively. Then, the necessary signals such as a power source and a clock signal are respectively supplied to each the integrated circuit through the control signal lines, and the self-diagnostic circuit mounted in the integrated circuits is operated to test the own integrated circuit. The self-diagnostic result to each the integrated circuit is derived respectively through the output signal lines and the integrated circuits can be tested by monitoring this self-diagnostic result with an external monitor unit.

The conventional test method described above has the following problems. In the configuration, the output signal lines are derived individually from each the integrated circuit formed on the silicon wafer 1 and the integrated circuits are tested by individually monitoring the self-diagnostic results obtained through these output signal lines.

In the case of individually testing plural integrated circuits in a burn-in test carried out under high-temperature environments, it takes a considerable time to complete the tests of all the integrated circuits and the efficiency of the tests are reduced. Thus, the test time of the integrated circuits is preferably short. When the plural integrated circuits attempt to be tested at once in order to shorten the test time, output signal lines and monitor units by the number of integrated circuits are required in order to respectively monitor the self-diagnostic results obtained from each the integrated circuit in the configuration shown in FIG. 7.

In the configuration shown in FIG. 7, the number of output signal lines arranged on the connection probe wired sheet 30 also increases in proportion to the number of integrated circuits formed on the silicon wafer 31, but there is a physical limit to the number of output signal lines capable of being arranged on the connection probe wired sheet 30. Also, it is impractical to prepare the monitor units by the number of integrated circuits. Further, with an increase in the output signal lines and the monitor units, the whole test system becomes complicated and expensive and this is reflected on manufacturing costs of the integrated circuits, so that a situation in which productivity of the integrated circuits including the test system reduces is caused.

SUMMARY OF THE INVENTION

The invention was made to solve the conventional problems, and it is an object of the invention to provide a test apparatus of a semiconductor integrated circuit capable of effectively monitoring each self-diagnostic result from plural integrated circuits and also reducing the number of output signal lines connected to the integrated circuits to a necessary minimum.

In order to solve the problems of the conventional art described above, a test apparatus of an integrated circuit according to the first aspect of the invention comprises plural integrated circuits in which a self-diagnostic circuit is included and a self-diagnostic result obtained from said self-diagnostic circuit is outputted and controlled by at least one control signal supplied from the outside, and each the self-diagnostic result of the plural integrated circuits is respectively supplied to one monitor every plural self-diagnostic results and control is performed by the control signal so that any one of the self-diagnostic results of the plural integrated circuits supplied to said monitor is outputted.

A test apparatus of an integrated circuit according to the second aspect of this invention is characterized in that the integrated circuits comprising an input terminal to which the control signal is supplied, an output terminal for outputting the self-diagnostic result and a tri-state buffer in which output disable or output enable of the self-diagnostic result is controlled by the control signal are arranged in a matrix shape, and while each the input terminal of the plural integrated circuits is connected in common every row through a control signal line for inputting the control signal, each the output terminal of the plural integrated circuits is connected in common every column through an output signal line for outputting the self-diagnostic result and is respectively connected to the monitor every column, and any one row of the plural integrated circuits is selected by the control signal and outputs of the self-diagnostic results of the selected integrated circuits are enabled and also outputs of the self-diagnostic results of the integrated circuits of the other rows are disabled, and the self-diagnostic results of each the integrated circuit arranged in the selected one row are respectively supplied to the monitor.

A test apparatus of an integrated circuit according to the third aspect of this invention is characterized in that the integrated circuits comprising plural input terminals to which a plurality of the control signals are respectively supplied, an output terminal for outputting the self-diagnostic result and a tri-state buffer in which output disable or output enable of the self-diagnostic result is controlled by a combination of the plural control signals are arranged in a matrix shape, and while each the input terminal of the plural integrated circuits is connected in common every row through plural control signal lines for inputting the control signals, each the output terminal of the plural integrated circuits is connected in common every plural matrices through an output signal line for outputting the self-diagnostic result and is respectively connected to the monitor every plural matrices connected in common, and any one of the plural integrated circuits in the plural matrices connected in common is selected by the combination of the control signals and outputs of the self-diagnostic results of the selected integrated circuits are enabled and also outputs of the self-diagnostic results of the other integrated circuits are disabled, and the self-diagnostic results of each the selected integrated circuit are respectively supplied to the monitor.

A test apparatus of an integrated circuit according to the fourth aspect of this invention is characterized in that the self-diagnostic results include a signal indicating whether stress applied to the integrated circuits is normal or not when a burn-in test is conducted to the integrated circuits.

A test apparatus of an integrated circuit according to the fifth aspect of this invention is characterized in that the plural integrated circuits are arranged on a wafer.

A test apparatus of an integrated circuit according to the sixth aspect of this invention is characterized in that the plural integrated circuits are mounted in sockets for electrically making connections to the integrated circuits in a state of packaging.

According to the first aspect of the invention, the plural integrated circuits are respectively divided into groups connected to one monitor and any one of the plural integrated circuits in each the group is selected to monitor the self-diagnostic results of the selected integrated circuits. As a result of this, the self-diagnostic results of the plural integrated circuits can be checked by the one monitor and also, the number of output signal lines can be reduced to a necessary minimum since the self-diagnostic results is connected to the monitor every group.

According to the second aspect of the invention, a group is constructed in one row unit. Then, any one row is selected by the control signal and only the integrated circuits arranged on the row can be set to an active state. The self-diagnostic results of each the integrated circuit arranged on the row are respectively checked by corresponding monitors. The self-diagnostic results of all the integrated circuits can be checked by sequentially performing selection operations by the control signal every one row.

According to the third aspect of the invention, one group is constructed every plural matrices. Then, any one of the integrated circuits in the group is selected by a combination of the control signals and only one integrated circuit in each the group can respectively be set to an active state. The self-diagnostic result of the integrated circuit selected in each the group is respectively checked by corresponding monitors. The self-diagnostic results of all the integrated circuits can be checked by sequentially performing selection operations by the combination of the control signals every plural columns.

According to the fourth aspect of the invention, in the burn-in test, the plural integrated circuits can be tested by deriving the minimum output signal lines from integrated circuits within a constant temperature bath. Also, the plural integrated circuits can be tested in a short time and thus, efficiency of tests improves.

BRIEF DESCRIPTION OF THE DRAWINGS

FIG. 7 is a diagram showing a configuration for self-diagnosing semiconductor integrated circuits formed on a silicon wafer.

DESCRIPTION OF THE PREFERRED EMBODIMENTS

Figure 1:
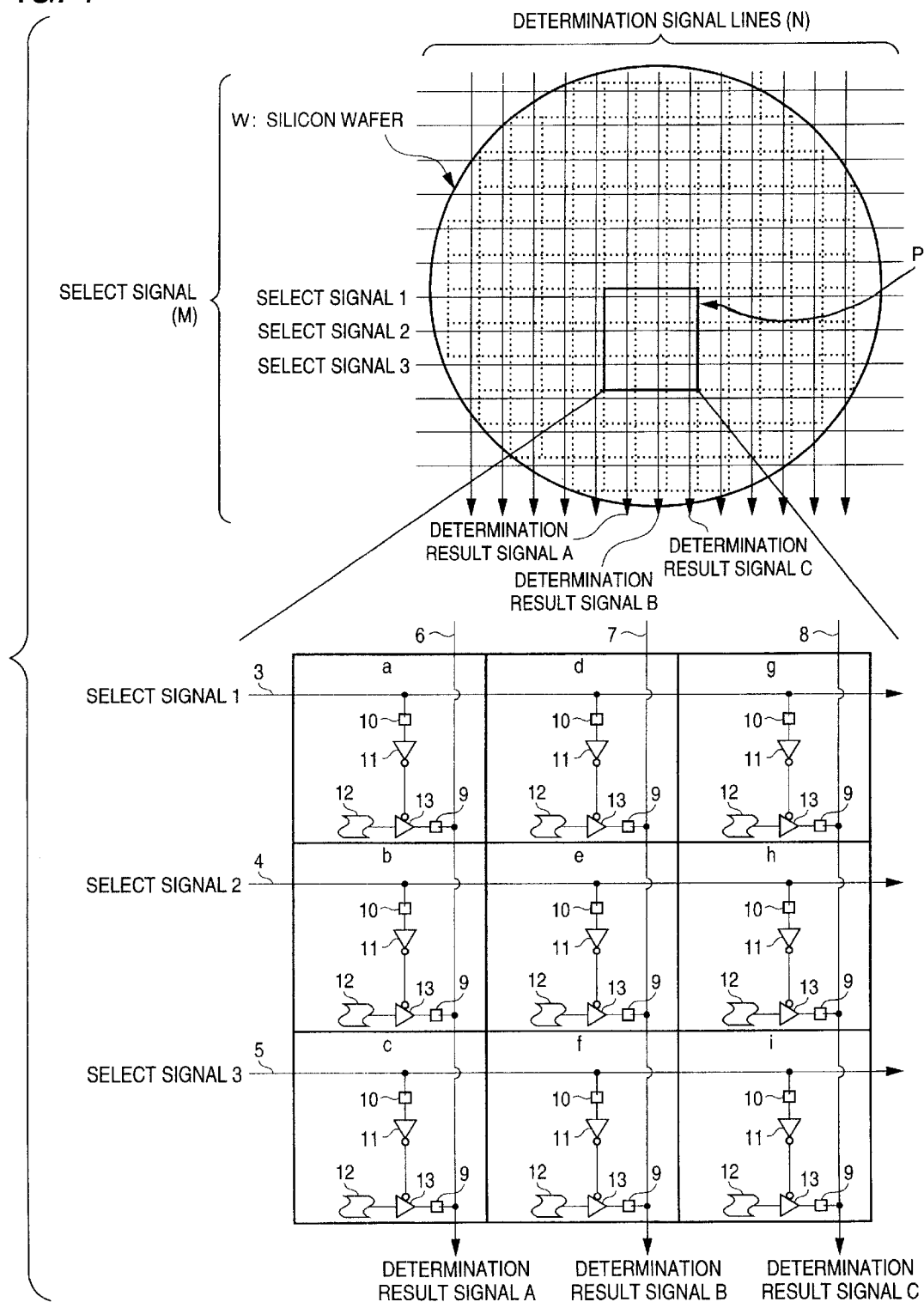
FIG. 1 a configuration diagram showing a first embodiment of the invention.

A first embodiment of the invention will be described below with reference to the accompanying drawings. As shown in FIG. 1, plural integrated circuits are formed in a matrix array on a silicon wafer 1 and in each the integrated circuit, select signals are supplied through plural select lines (control signal lines) arranged in row directions respectively on a wired sheet (not shown) and also determination result signals are derived through plural determination signal lines (output signal lines) arranged in column directions. The select line is a line for supplying the select signal for selecting the desired integrated circuit to derive a self-diagnostic result, and the determination signal line is a line for supplying the determination result signal indicating the self-diagnostic result obtained from each the integrated circuit to a monitor.

Paying attention to nine (three by three) integrated circuits a to i arranged in a partially enlarged area P for the integrated circuits on the silicon wafer W, in the row directions, a select signal 1 is supplied to the integrated circuits a, d, g through a select signal line and a select signal 2 is supplied to the integrated circuits b, e, h and a select signal 3 is supplied to the integrated circuits c, f, i. Also, in the column directions, a determination result signal A is derived from the integrated circuits a, b, c through a determination signal line 6 and a determination result signal B is derived from the integrated circuits d, e, f through a determination signal line 7 and a determination result signal C is derived from the integrated circuits g, h, i through a determination signal line 8. Each the select signal line is connected to a select signal input terminal (input terminal) 10 constructing the integrated circuits, respectively, and the determination signal lines are connected to a determination result output terminal (output terminal) 9, respectively.

Figure 2:
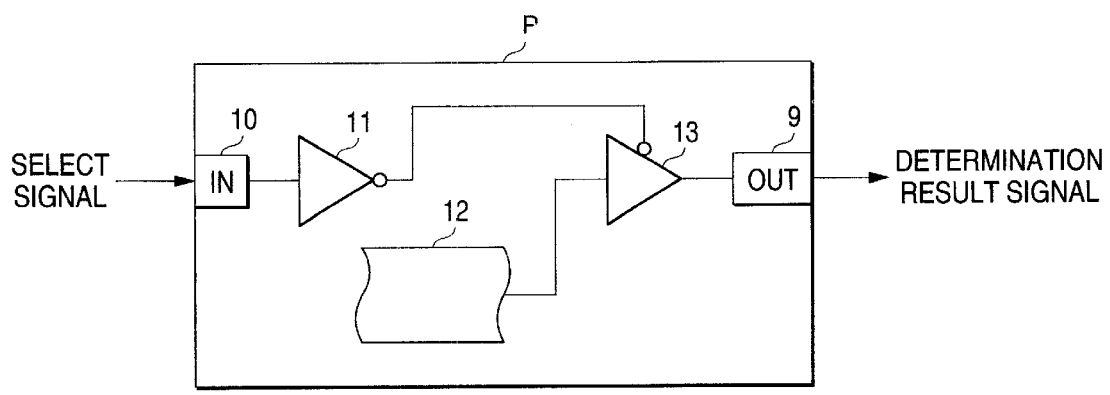
FIG. 2 is a configuration diagram showing semiconductor integrated circuits indicated in FIG. 1.

As shown in FIG. 2, the select signal supplied to the input terminal 10 is inverted and supplied to a control terminal of a tri-state buffer 13 for controlling a tri-state output of the determination result signal obtained from an internal circuit and self-diagnostic circuit 12 through an inverter 11. The determination result signal is supplied to an input terminal of the tri-state buffer 13, and output disable or output enable is controlled by the select signal supplied to the control terminal and is derived to the output terminal 9.

In the case of carrying out a self-diagnosis to all the integrated circuits on the silicon wafer W, a clock input or terminal fixing can be common to all the integrated circuits. Thus, all the integrated circuits can be self-diagnosed by controlling input signals by the number of input signals necessary for the self-diagnosis to one integrated circuit.

A method for monitoring a self-diagnostic determination result of the integrated circuit will be described below. The integrated circuits a to i within a partially enlarged area P on the silicon wafer W shown in FIG. 1 are grouped in a column unit as a set of (a, b, c), a set of (d, e, f) and a set of (g, h, i). The plural integrated circuits constructing each of the grouped sets are connected to one another by the determination signal lines connected to the output terminals 9, respectively. As a result of this, the respective determination result signals obtained from the plural integrated circuits constructing each of the sets are derived through the connected determination signal lines. That is, as the example shown in the drawing, the determination result signals A, B, C are respectively derived from a set of (a, b, c), a set of (d, e, f) and a set (g, h, i). Further, the integrated circuits a to i are grouped in a row unit as a set of (a, d, g), a set of (b, e, h), and a set of (c, f, i). The plural integrated circuits constructing each the grouped set are connected one another by the select lines connected to the input terminals 10, respectively.

In the integrated circuits shown in FIG. 2, when the select signal supplied to the input terminal 10 is set at a "H (high)" level (active input), the tri-state buffer 13 becomes an active state and the determination result signal outputted from the internal circuit and self-diagnostic circuit 12 is derived from the output terminal 9. When the select signal supplied to the input terminal 10 is set at a "L (low)" level (non-active input), the tri-state buffer 13 becomes a nonactive state and the output terminal 9 becomes a high impedance state.

In the configuration shown in FIG. 1, when a select signal 1 supplied through a select signal line 3 is set at a "H" level and select signals 2, 3 supplied through select signal lines 4, 5 are set at a "L" level, the tri-state buffers 13 constructing the integrated circuits a, d, g out of the integrated circuits a to i become an active state and the determination result signals of the integrated circuits a, d, g are derived from the output terminals 9. On the other hand, the tri-state buffers 13 constructing the integrated circuits b, e, h, c, f, i become a non-active state and the output terminals 9 become a high impedance state. As a result of this, determination result signals of the integrated circuits a, d, g are respectively derived through determination signal lines 6, 7, 8 as determination result signals A, B, C. Self-diagnostic results of the integrated circuits a, d, g can be monitored by respectively supplying these determination result signals A, B, C to an external monitor.

Next, when the select signal 2 is set at a "H" level and the select signals 1, 3 are set at a "L" level, the tri-state buffers 13 constructing the integrated circuits b, e, h out of the integrated circuits a to i become an active state and the determination result signals of the integrated circuits b, e, h are derived from the output terminals 9. On the other hand, the tri-state buffers 13 constructing the integrated circuits a, d, g, c, f, i become a non-active state and the output terminals 9 become a high impedance state. As a result of this, self-diagnostic results of the integrated circuits b, e, h are respectively derived through the determination signal lines 6, 7, 8 as determination result signals A, B, C. The self-diagnostic results of the integrated circuits b, e, h can be monitored by respectively supplying these determination result signals A, B, C to the external monitor.

As described above, arbitrary one row is selected from plural sets of (a, b, c), (d, e, f), (g, h, i) of the integrated circuits grouped in the column unit in relation to the integrated circuits a to i and the determination result signals of the integrated circuits of the one row selected from each the sets are respectively derived and thereby, the integrated circuits of the selected one row can be self-diagnosed.

Though the nine (three by three) integrated circuits a to i on the silicon wafer 1 shown in FIG. 1 have been described above, M by N integrated circuits on the silicon wafer 1 are grouped in a column unit as described above and arbitrary one row is selected from the M by N integrated circuits and a self-diagnosis can be carried out.

That is, in relation to the integrated circuits formed on the silicon wafer 1, N groups consisting of plural integrated circuits connected one another are constructed in column directions. The N groups are connected to N monitors, respectively. Each the group is constructed of a maximum of M integrated circuits, respectively, and M select signal lines arranged in row directions are respectively connected to the plural integrated circuits constructing each the group without overlap. In this configuration, the M by N integrated circuits are selected sequentially every N integrated circuits in the row directions. The self-diagnostic results of the selected N integrated circuits are simultaneously checked by the N monitors, respectively.

Figure 3:
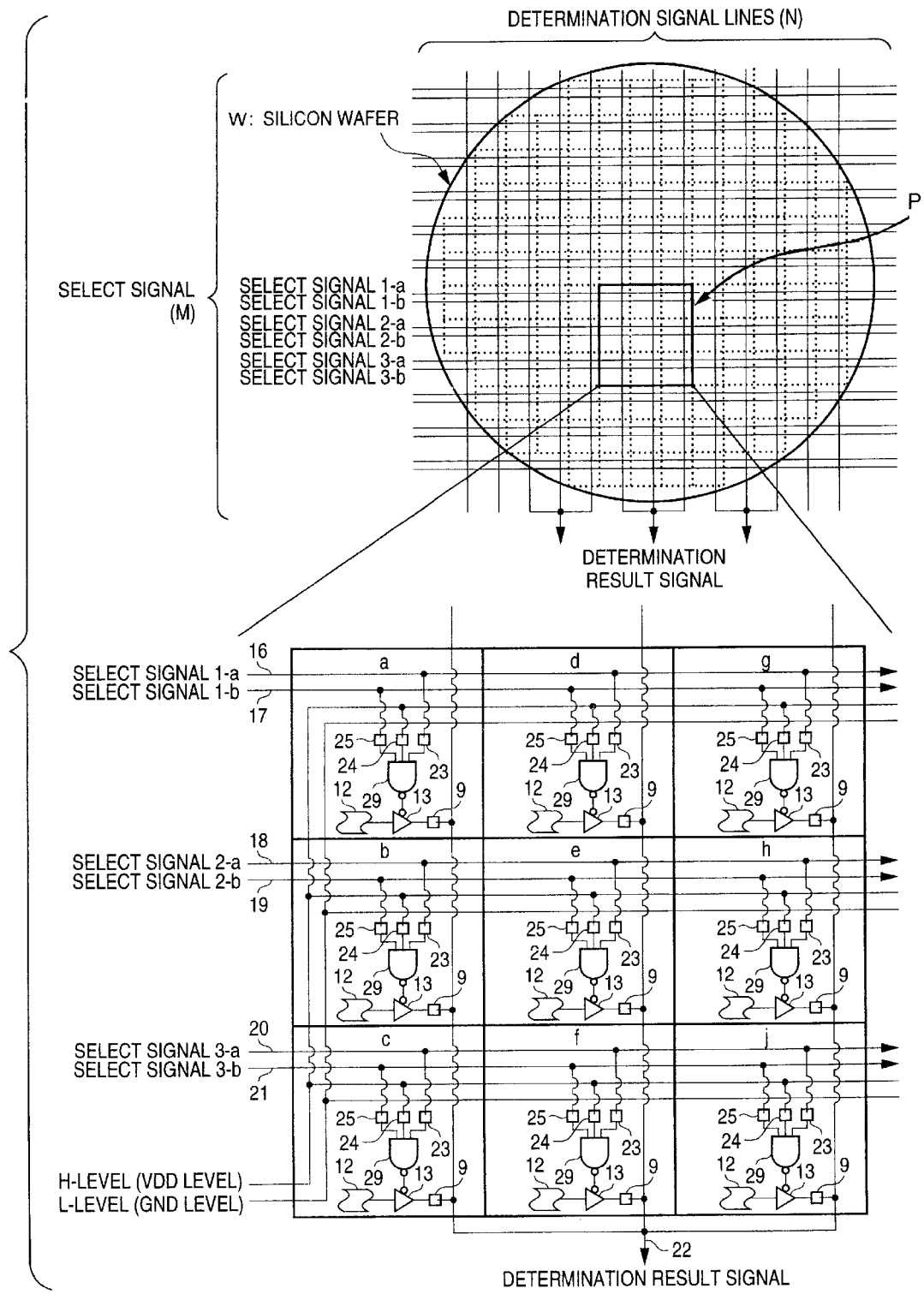
FIG. 3 is a configuration diagram showing a second embodiment of the invention.

A second embodiment will be described below with reference to FIGS. 3 and 4. Incidentally, a detailed description is omitted by marking the same parts as parts indicated in FIGS. 1 and 2 with the same reference signs. As shown in FIG. 3, two select signals are supplied to each the integrated circuit on the silicon wafer 1, respectively. That is, paying attention to a partially enlarged area 9, select signals 1-*a*, 1-*b* are supplied to integrated circuits (a, d, g) through select lines 16, 17 and select signals 2-*a*, 2-*b* are supplied to integrated circuits (b, e, h) through select lines 18, 19 and select signals 3-*a*, 3-*b* are supplied to integrated circuits (c, f, i) through select lines 20, 21. Also, a determination signal line 22, which is obtained by grouping the integrated circuits into one group every three columns, is connected to a monitor.

Figure 4:
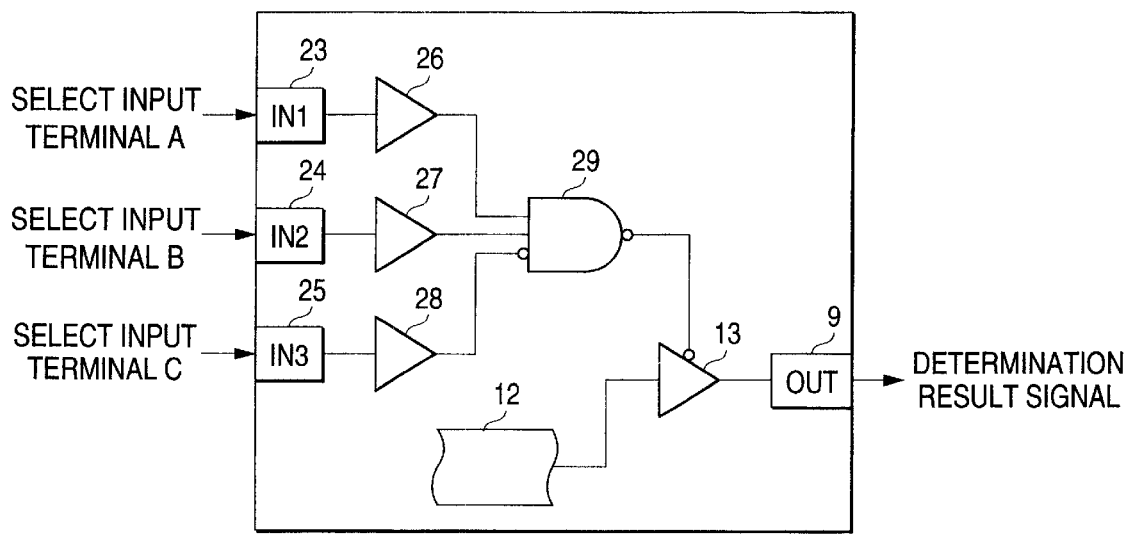
FIG. 4 is a configuration diagram showing semiconductor integrated circuits indicated in FIG. 3.

FIG. 4 shows an integrated circuit which comprises an internal circuit and self-diagnostic circuit 12, a tri-state buffer 13 for deriving a self-diagnostic result to an output terminal 9, and a three-input type NAND circuit 29 for inverting and supplying NAND outputs of signals supplied to input terminals 23, 24, 25 to a control terminal of the tri-state buffer 13. The signals supplied to the input terminals 23, 24, 25 are supplied to the NAND circuit 29 through buffers 26, 27, 28, respectively, and the signal supplied to the input terminal 25 is further inverted and supplied to the NAND circuit 29.

In the case of carrying out a self-diagnosis to all the integrated circuits on the silicon wafer 1, a clock input or terminal fixing can be common to all the integrated circuits. Thus, all the integrated circuits can be self-diagnosed by controlling input signals by the number of input signals necessary for the self-diagnosis to one integrated circuit.

A method for monitoring a self-diagnostic determination result of the integrated circuit will be described below. As shown in FIG. 3, the integrated circuits a to i within a partially enlarged area 2 on the silicon wafer 1 connected one another through the determination signal line 22 connected to the output terminals 9, respectively. As a result of this, the respective self-diagnostic determination results obtained from each the integrated circuit are derived through the determination signal line 22. Further, the integrated circuits a to i are grouped in a row unit in a manner similar to FIG. 1. The plural integrated circuits constructing each the grouped set are connected one another by the two select lines, respectively. That is, a set of (a, d, g) are connected by the select lines 16, 17 and a set of (b, e, h) are connected by the select lines 18, 19 and a set of (c, f, i) are connected by the select lines 20, 21.

In the integrated circuits shown in FIG. 4, when the select signals supplied to the input terminals 23, 24 are set at a "H (1)" level and the select signal supplied to the input terminal 25 is set at a "L (0)" level (active input), the output tri-state buffer 13 becomes an active state and the self-diagnostic determination result outputted from the internal circuit and self-diagnostic circuit 12 is derived from the output terminal 9.

In FIG. 3, an input state to each the integrated circuit is set as follows in order to set a state in which any one is selected (three-state) and the whole is not selected by two kinds of select signals in relation to sets (a, d, g), (b, e, h), (c, f, i) of the integrated circuits connected by the common select signal lines.

That is, in the integrated circuit a, the input terminal 23 is connected to the select signal 1-a and the input terminal 24 is fixed to a "H" (VDD) level and the input terminal 25 is connected to the select signal 1-b. In the integrated circuit d, the input terminal 23 is connected to the select signal 1-b and the input terminal 24 is fixed to the "H" (VDD) level and the input terminal 25 is connected to the select signal 1-a. In the integrated circuit g, the input terminal 23 is connected to the select signal 1-a and the input terminal 24 is connected to the select signal 1-b and the input terminal 25 is fixed to a "L" (GND) level.

By the configuration described above, each the integrated circuit a, d, g is selected and controlled to an active state or a non-active state, respectively, by changing the input state of the select signals (1-a, 1-b) to the integrated circuits (a, d, g). That is, all the integrated circuits a, d, g are set to the non-active state by setting the input state of the select signals (1-a, 1-b) to (0, 0), and the integrated circuit a is set to the active state and the integrated circuits d, g are set to the non-active state by setting the input state to (0, 1), and the integrated circuit d is set to the active state and the integrated circuits a, g are set to the non-active state by setting the input state to (1, 0), and the integrated circuit g is set to the active state and the integrated circuits a, d are set to the non-active state by setting the input state to (1, 1).

Similarly below, by respectively connecting the integrated circuits (b, e, h), (c, f, i) to the corresponding select signals (2-a, 2-b), (3-a, 3-b) and changing the input state of the select signals (2-a, 2-b), (3-a, 3-b), each the integrated circuit (b, e, h) and (c, f, i) is selected and controlled to the active state or the non-active state, respectively.

By setting any one of sets of the select signals (1-a, 1-b), (2-a, 2-b), (3-a, 3-b) to any one of (0, 1), (1, 0), (1, 1) and setting the other sets to (0, 0) in the configuration described above, only any one of the integrated circuits a to i is set to the active state and a self-diagnostic determination result of this integrated circuit is derived from the output terminal. On the other hand, the other integrated circuits are set to the non-active state and the output terminals become a high impedance state. As a result of this, only a self-diagnostic determination result of any one of the integrated circuits a to i is derived from the determination signal line 22 respectively connecting the integrated circuits a to i.

As described above, the self-diagnostic determination results of the integrated circuits a to i are sequentially derived by sequentially performing operations of selecting and setting only any one of the integrated circuits to the active state in relation to the integrated circuits a to i. Thus, all the self-diagnostic determination results of the integrated circuits a to i can be monitored by one monitor for respectively making short-circuit connections of the integrated circuits a to i.

As described above in the integrated circuits a to i, three integrated circuits can be selected and controlled to the active state or the non-active state by two kinds of select signals on a row and the self-diagnostic determination results can be monitored by one monitor. Similarly, in relation to all the integrated circuits formed on the silicon wafer 1 shown in FIG. 3, when N groups of the integrated circuits connected to N monitors are constructed and the number of integrated circuits included in each the group is a maximum of M, the integrated circuits in each the group are arbitrarily selected and controlled by means of M by ⅔ select lines. FIG. 3 shows an example in which the number of integrated circuits included in each the group is three and the integrated circuits are controlled by common two select lines. That is, in each the group, by sequentially setting the input state of the common two select lines to any one of (0, 1), (1, 0), (1, 1) and setting the input state of the other select lines to (0, 0), the self-diagnostic determination results can be monitored in relation to all the integrated circuits in the groups.

Incidentally, though the case of controlling three integrated circuits by two kinds of select signals on a row has been described above, $(2^P-1)$ integrated circuits can be controlled by P select lines similarly.

Figure 5:
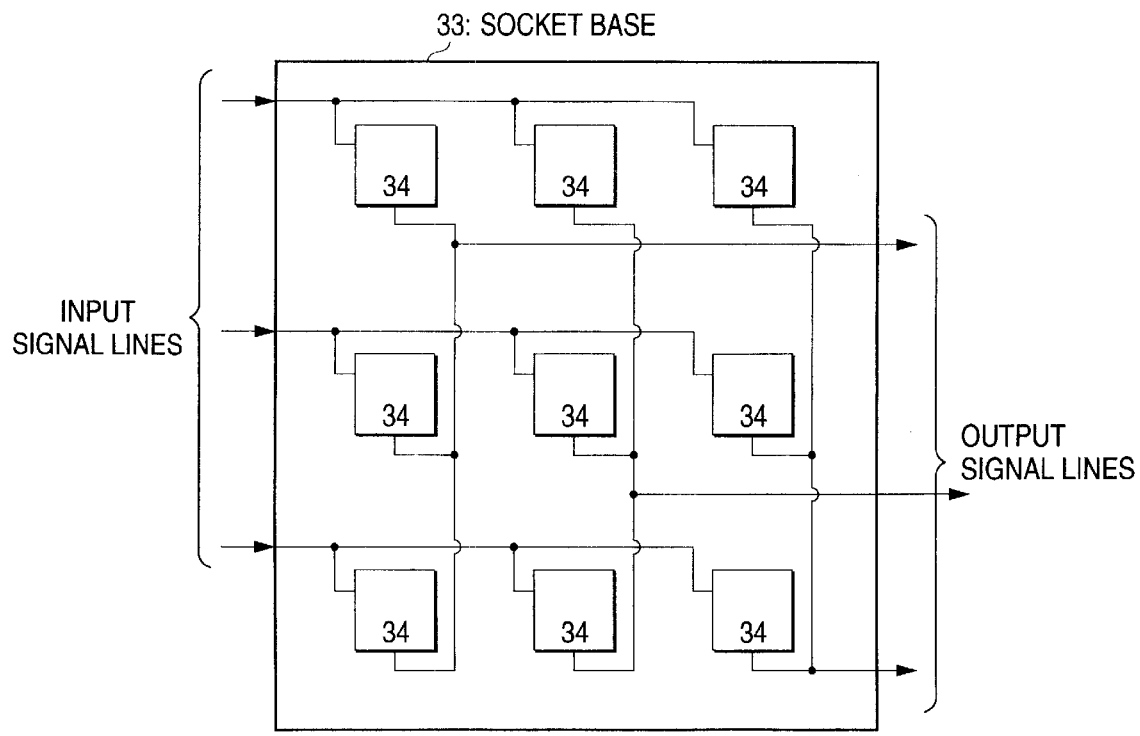
FIG. 5 is a configuration diagram showing a third embodiment of the invention and corresponds to the first embodiment.

A third embodiment will be described below with reference to FIGS. 5 and 6. Though the case of testing the integrated circuits formed on the silicon wafer is described in the first and second embodiments, tests to the integrated circuits conducted on the silicon wafer are conducted to the integrated circuits mounted in slots in a state of packaging in the third embodiment. FIG. 5 corresponds to the first embodiment and FIG. 6 corresponds to the second embodiment.

Figure 6:
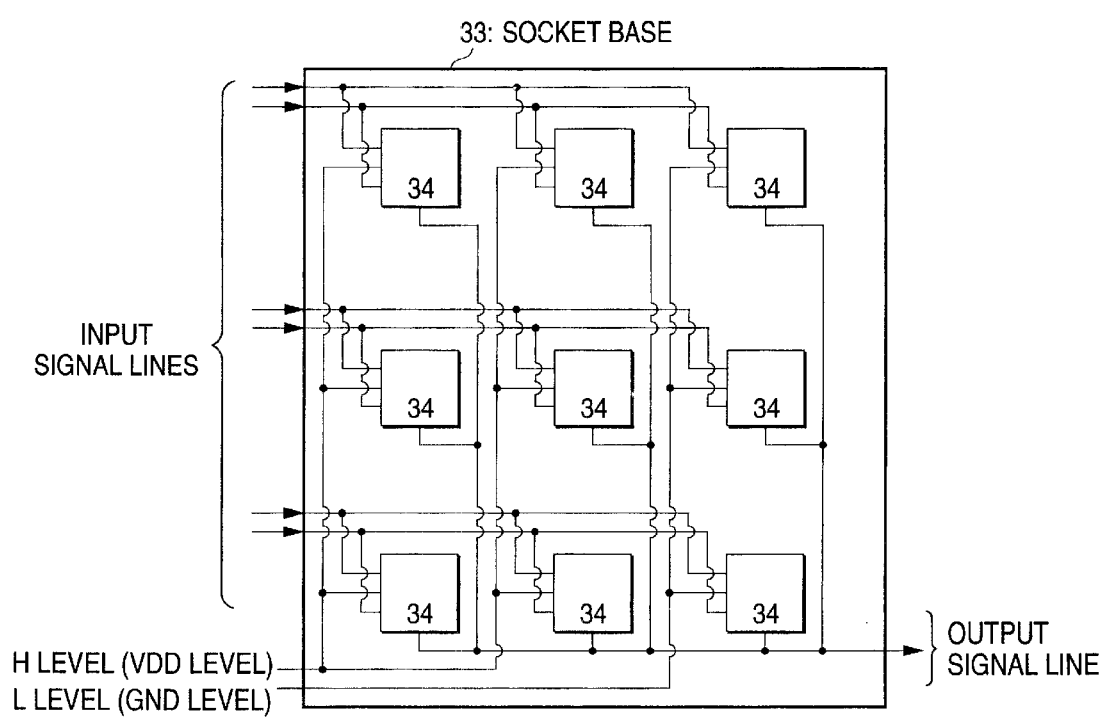
FIG. 6 is a configuration diagram showing the third embodiment of the invention and corresponds to the second embodiment.

As shown in FIGS. 5 and 6, plural sockets 34 in which integrated circuits are mounted are arranged on a socket substrate 33, and input signal lines and output signal lines, respectively, are electrically connected to each slot through terminals (not shown). In a configuration shown in FIG. 5, the input signal lines and the output signal lines are connected to each the slot so as to obtain the same functions as that of the first embodiment. Also, in a configuration shown in FIG. 6, the input signal lines and the output signal lines are connected to each the slot so as to obtain the same functions as that of the second embodiment.

In the case of testing the packaged integrated circuits, the connection probe wired sheet 30 such as shown in FIG. 7 can be substituted by the socket substrate 33. As a result of this, tests similar to that of first and second embodiments can be conducted.

Incidentally, the case that the integrated circuit becomes active (high active) when the select signal is a "H" level has been described in the first to third embodiments, but a change may be made so that the integrated circuit becomes active (low active) when the select signal is a "L" level. Also, monitoring of the self-diagnostic determination results obtained from the integrated circuits includes the case of monitoring determination results based on blinking in addition to the case of monitoring determination results based on waveforms.

A fourth embodiment will be described below. The fourth embodiment is constructed so that determination result signals include a signal indicating that burn-in stress is normally applied when a burn-in test is conducted to integrated circuits formed on the silicon wafer or integrated circuits mounted in slots in a state of packaging.

The burn-in test is intended for preventing integrated circuits with initial failure from coming on the market, and stress is applied by inputting a signal from an input terminal and operating the integrated circuits while maintaining in a state of high temperature and the integrated circuits with a high possibility that initial failure occurs is broken by the stress application. Because of that, it is important that proper stress be applied in the burn-in test and it is necessary to check to see that the stress is properly applied. Thus, in the configurations shown in the first to third embodiments, by including a state of stress applied to the integrated circuits in the self-diagnostic determination results, the state of stress applied to the integrated circuits can effectively be checked and productivity in the burn-in test increases.

What is claimed is:

1. A test apparatus of a plurality of integrated circuits configured in a matrix array comprising rows and columns, each integrated circuit of the matrix array including a self-diagnostic circuit of which diagnostic result is outputted and controlled by at least one control signal being supplied from an outside of the matrix array, wherein respective diagnostic results of self-diagnostic circuits of the matrix array are supplied to a monitor and controlled by the at least one control signal so that one of the diagnostic results is selected, each integrated circuit of the matrix array further comprising:

a set of input terminals to which a set of control signals are respectively supplied;

an output terminal for outputting the self-diagnostic result; and a tri-state buffer in which an output-disable state or an output-enable state of the diagnostic result is controlled by a combination of the set of control signals;

the test apparatus further comprising:

a set of control signal lines associated with each of said rows, and respective control signal lines of each set being commonly connected to respective input terminals of said set of input terminals of each of the integrated circuits in the respective row for inputting the set of control signals; and an output signal line associated with each of said columns, each output signal line being commonly connected to the output terminal of each integrated circuit in the respective column for outputting the diagnostic results, and each output signal line being commonly connected to the monitor;

wherein any one of the integrated circuits of a row is selected by the set of control signals so that an output of the diagnostic results of the selected integrated circuit of the row is set to be enable while outputs of the diagnostic results of other sub-integrated circuits of the row are set to be disable, and said diagnostic results of the row are supplied to the monitor.

2. A test apparatus of a plurality of integrated circuits as defined in claim 1, wherein the diagnostic result includes a signal indicating whether stress applied to the integrated circuits is normal or not when a burn-in test is conducted to the matrix array.

3. A test apparatus of a plurality of integrated circuits as defined in claim 1, wherein the integrated circuits are arranged on a wafer.

4. A test apparatus of a plurality of integrated circuits as defined in claim 1, wherein the integrated circuits are mounted in sockets for electrically making connections to the integrated circuits in a state of packaging.

5. A test apparatus of a plurality of integrated circuits as defined in claim 1, wherein the diagnostic result includes a signal indicating whether stress applied to the integrated circuits is normal or not when a burn-in test is conducted to the matrix array.

* * * * *